(12) United States Patent
Oguri et al.

(10) Patent No.: US 6,409,576 B1
(45) Date of Patent: Jun. 25, 2002

(54) POLISHING APPARATUS

(75) Inventors: Syozo Oguri, Yokohama; Masafumi Inoue, Fujisawa; Saburo Takahashi, deceased, late of Fujisawa, all of (JP), by Chishio Takahashi, Mei Takahashi, legal representatives

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/626,124

(22) Filed: Jul. 26, 2000

(30) Foreign Application Priority Data

Jul. 26, 1999 (JP) ............................................ 11-211198

(51) Int. Cl.⁷ .............................................. B24B 49/00

(52) U.S. Cl. .............................. 451/6; 451/10; 451/11; 451/41; 451/54; 451/287

(58) Field of Search ........................... 451/6, 9, 10, 11, 451/41, 54, 59, 285, 287, 288

(56) References Cited

U.S. PATENT DOCUMENTS 5,679,055 A * 10/1997 Greene et al. ................. 451/10
5,679,060 A * 10/1997 Leonard et al. ............... 451/43
6,004,187 A * 12/1999 Nyui et al. ..................... 451/5
6,132,289 A * 10/2000 Labunsky et al. ............. 451/6

* cited by examiner

Primary Examiner—Eileen P. Morgan
(74) Attorney, Agent, or Firm—Wenderoth, Lind & Ponack, L.L.P.

(57) ABSTRACT

A polishing apparatus for polishing a surface of a workpiece has a polishing section for polishing a surface of a workpiece, a cleaning section for cleaning a polished surface of the workpiece, a rotating mechanism for rotating the workpiece during cleaning or after cleaning, and a sensor for detecting a reference position of the workpiece. The polishing apparatus further having a controller for controlling the rotating mechanism to stop the workpiece against rotation to align the reference position with a predetermined position based on a detecting signal from the sensor, and a film thickness measuring device for measuring a thickness of a polished surface layer of the aligned workpiece.

7 Claims, 7 Drawing Sheets

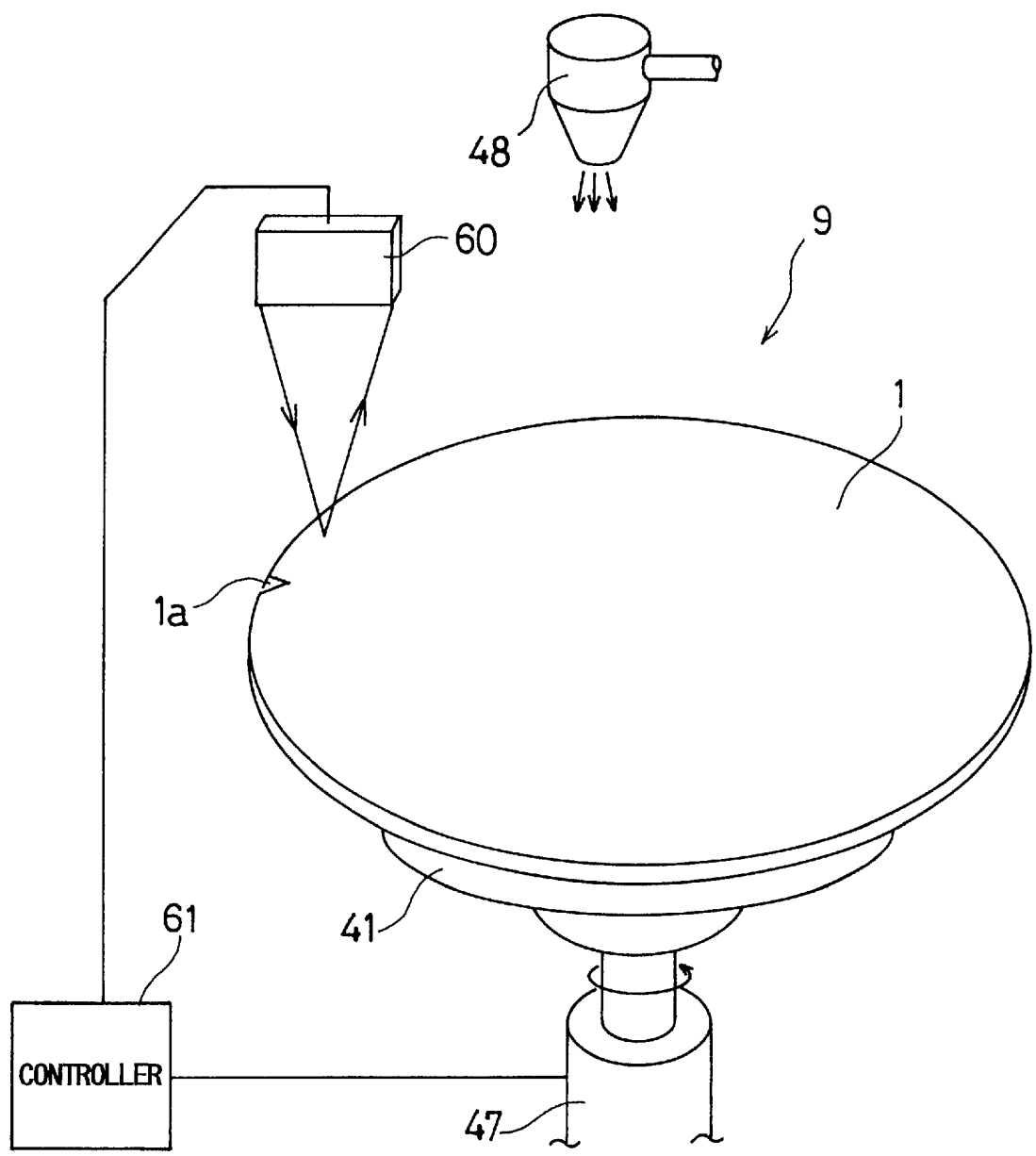
F I G. 4

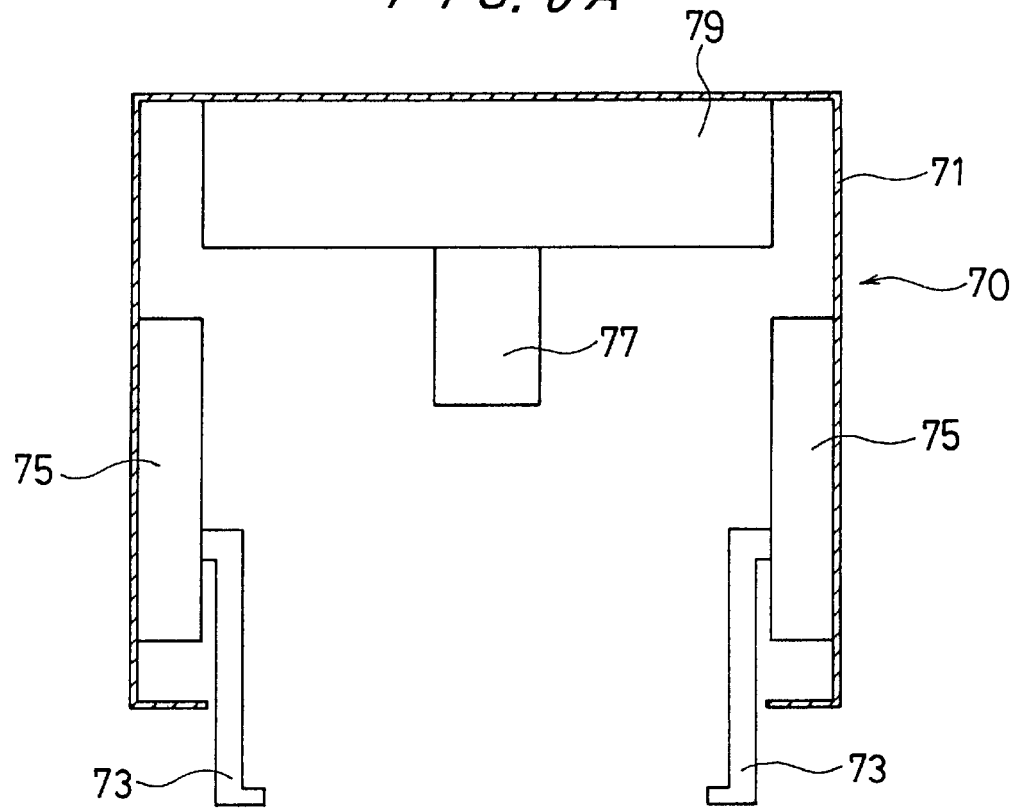
*F I G. 6A*
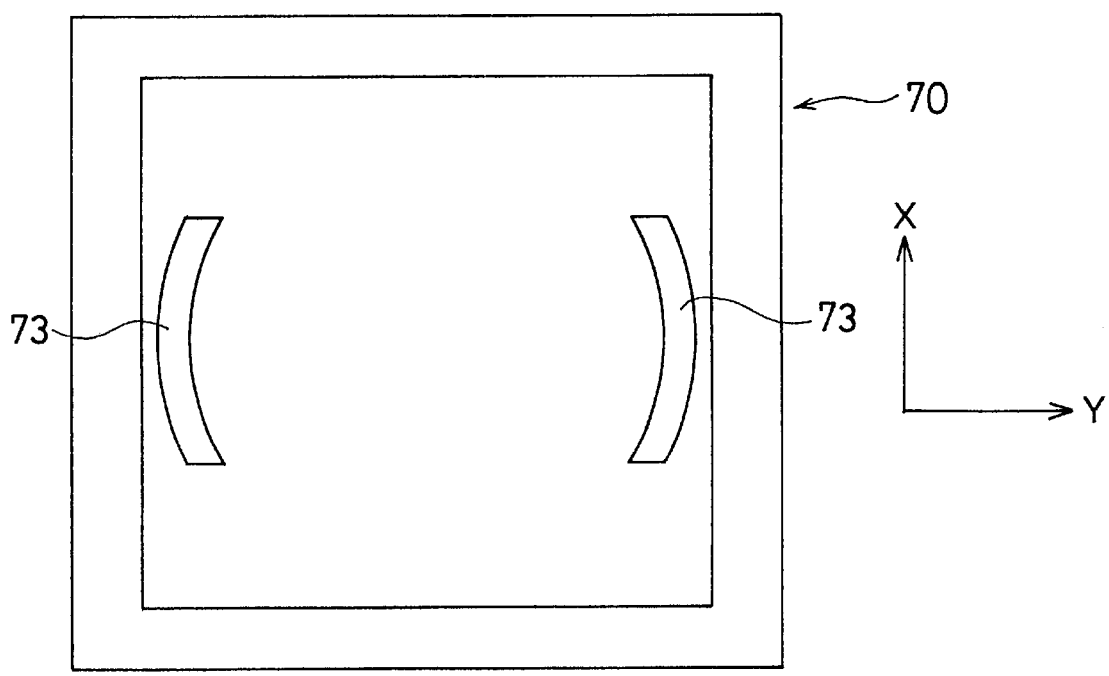
*F I G. 6B*

POLISHING APPARATUS

BACKGROUND OF THE INVENTION

1. Field of the Invention

The present invention relates to a polishing apparatus for polishing a workpiece such a semiconductor substrate, and more particularly to a polishing apparatus having a measuring function for accurately measuring a thickness of a surface layer of the workpiece which has been polished.

2. Description of the Related Art

In manufacturing processes of semiconductor substrates, a polishing apparatus has been employed for polishing a surface of a semiconductor substrate (workpiece) to a flat mirror surface. Such a polishing apparatus comprises a polishing section for polishing a semiconductor substrate by pressing a surface of the semiconductor substrate against a turntable having a polishing surface thereon while the semiconductor substrate and the polishing surface are relatively being moved, and a cleaning section for cleaning the semiconductor substrate which has been polished by the polishing section.

As semiconductor devices become more highly integrated in recently years, circuit interconnections on semiconductor substrates become finer and the distance between those circuit interconnections becomes smaller. However, when semiconductor substrates are processed, particles such as particles of semiconductor material, dust particles, crystalline protrusive particles, or the like often tend to be attached to the semiconductor substrates being processed. If a particle larger than the distance between interconnections exists on a semiconductor substrate, then the particle will short-circuit interconnections on the semiconductor substrate. Therefore, particles on a semiconductor substrate have to be sufficiently smaller than the distance between interconnections on the semiconductor substrate. To meet this demand, there has been required the technology for removing fine particles or submicronic particles from semiconductor substrates in the cleaning section.

As a cleaning method in the cleaning section, there has heretofore been known a scrubbing cleaning process of scrubbing a surface of a semiconductor substrate with a brush of nylon, mohair or the like, or a sponge of polyvinyl alcohol (PVA). Further, there has been known other processes, including an ultrasonic cleaning process of cleaning a semiconductor substrate by ejecting water having ultrasonic vibrational energy to a surface of the semiconductor substrate, a cavitation jet cleaning process of cleaning a semiconductor substrate by ejecting water containing cavitation to a surface of the semiconductor substrate, and the like. A cleaning process which combines two or three of the above processes is more effective in removing fine particles from the semiconductor substrate. Therefore, a plurality of cleaning machines for conducting such cleaning processes are often arranged in the cleaning section of the polishing apparatus.

On the other hand, a film thickness measuring device, e.g., an inline thickness measurement device (ITM), for measuring a film thickness, i.e., a thickness of a surface layer of a semiconductor substrate which has been polished is often incorporated in the cleaning section besides the above cleaning machines.

However, the above conventional cleaning machine does not have a mechanism for detecting the reference position on a semiconductor substrate, which may be represented by an orientation flat or a notch, and aligning the semiconductor substrate with a certain direction. In addition, the film thickness measuring device does not have a mechanism for detecting the reference position on a semiconductor substrate and aligning the semiconductor substrate with a certain direction.

Therefore, measuring points on the semiconductor substrate at which a thickness of the surface layer is to be measured by a film thickness measuring device cannot be accurately recognized in the present condition. In the some cases, although the rectangular direction of a semiconductor substrate is recognized by an image processing, the measuring points cannot be accurately specified by the image processing.

In order to solve the above problems, an additional device for aligning the reference position on a semiconductor substrate with a certain direction is required. However, such an additional device not only causes higher cost, but also makes a polishing apparatus larger.

SUMMARY OF THE INVENTION

The present invention has been made in view of the above drawbacks. It is therefore an object of the present invention to provide a polishing apparatus which can accurately measure a film thickness of the workpiece which has been polished.

According to an aspect of the present invention, there is provided a polishing apparatus for polishing a surface of a workpiece, comprising: a polishing section for polishing a surface of a workpiece; a cleaning section for cleaning a polished surface of the workpiece; a rotating mechanism for rotating the workpiece during cleaning or after cleaning; a sensor for detecting a reference position of the workpiece; a controller for controlling the rotating mechanism to stop the workpiece against rotation to align the reference position with a predetermined position based on a detecting signal from the sensor; and a film thickness measuring device for measuring a thickness of a polished surface layer of the aligned workpiece.

With the above arrangement, the workpiece which has been polished by the polishing section is rotated during cleaning or after cleaning by the rotating mechanism, and the controller controls the rotating mechanism to stop the workpiece against rotation to align the reference position with a predetermined position. Therefore, since the workpiece which has been cleaned by the cleaning section is aligned with the predetermined direction, the film thickness measuring device can accurately measure a film thickness at the predetermined measuring points.

In a preferred aspect of the present invention, the rotating mechanism is incorporated in a cleaning machine, and the workpiece is cleaned or dried while the workpiece is rotated by the rotating mechanism. On the other hand, the rotating mechanism may be incorporated in other devices which operate the workpiece after cleaning, e.g., the film thickness measuring device.

In a preferred aspect of the present invention, the controller controls the rotating mechanism to control a rotational speed of the workpiece.

The controller may lower a rotational speed of the workpiece when the reference position of the workpiece is detected by the sensor.

In a preferred aspect of the present invention, the controller controls the rotating mechanism to control a rotational speed of the workpiece based on an elapsed time since the detection of the reference position by the sensor.

Preferably, the sensor may comprise a photosensor.

According to another aspect of the present invention, there is provided a polishing method for polishing a surface of a workpiece, comprising: polishing a surface of a workpiece; cleaning a polished surface of the workpiece; aligning a reference position of the workpiece with a predetermined position; and measuring a thickness of the polished surface layer of the aligned workpiece.

The above and other objects, features, and advantages of the present invention will be apparent from the following description when taken in conjunction with the accompanying drawings which illustrates preferred embodiments of the present invention by way of example.

BRIEF DESCRIPTION OF THE DRAWINGS

FIG. 4 is a perspective view schematically showing a tertiary cleaning machine shown in FIG. 1;

FIG. 6A is a vertical cross-sectional view showing the film thickness measuring device shown in FIG. 5;

FIG. 6B is a bottom view showing the film thickness measuring device shown in FIG. 5.

DETAILED DESCRIPTION OF THE PREFERRED EMBODIMENTS

Figure 1:
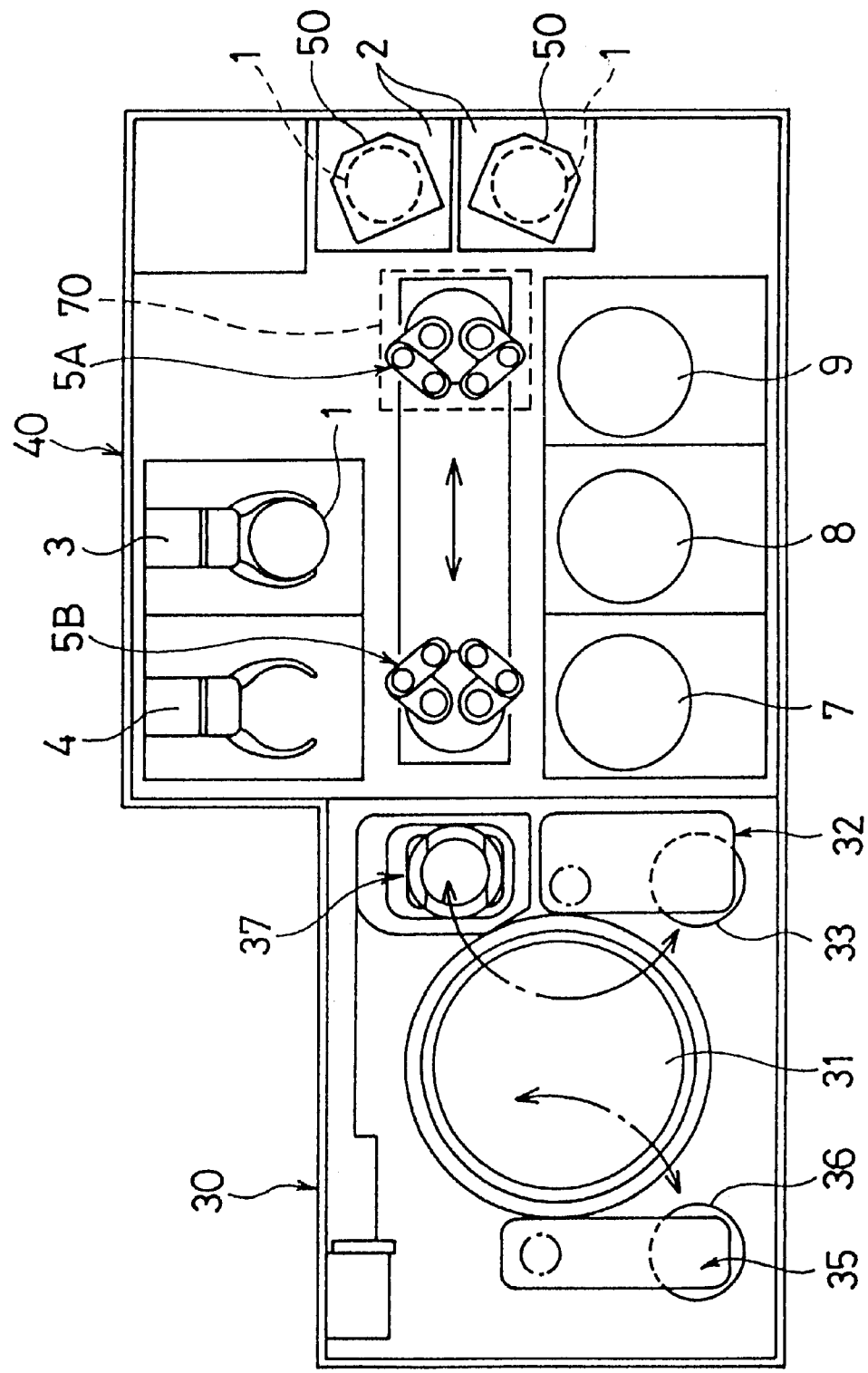
FIG. 1 is a schematic plan view showing a polishing apparatus according to an embodiment of the present invention.

A polishing apparatus according to an embodiment of the present invention will be described below with reference to the drawings. Like or corresponding parts are denoted by like or corresponding reference numerals throughout views.

In a polishing process of a semiconductor substrate carried out by a polishing apparatus according to the present invention, a semiconductor substrate is polished to a flat mirror surface while a polishing liquid containing abrasive particles is being supplied to a surface of the semiconductor substrate. Therefore, immediately after the semiconductor substrate has been polished, the polishing liquid containing abrasive particles and ground-off particles of semiconductor material are attached to the polished surface of the semiconductor substrate, and hence the polished surface is contaminated with them. In this embodiment, the semiconductor substrate that has been polished is cleaned by a plurality of successive cleaning processes to remove those contaminants from the polished surface of the semiconductor substrate, and then a film thickness, i.e., a thickness of a surface layer of the polished surface of the semiconductor substrate is measured.

FIG. 1 is a plan view showing a polishing apparatus according to the present invention. As shown in FIG. 1, the polishing apparatus comprises a polishing section 30 for polishing semiconductor substrates 1 and a cleaning section 40 for cleaning the semiconductor substrates 1 which have been polished by the polishing section 30. The polishing section 30 and the cleaning section 40 are joined to each other.

The polishing section 30 comprises a turntable 31 disposed in a central position therein, a top ring unit 32 disposed on one side of the turntable 31 and having a top ring 33 for holding a semiconductor substrate 1, a dressing unit 35 disposed on an opposite side of the turntable 31 and having a dressing tool 36 for dressing a polishing cloth attached to the upper surface of the turntable 31, and a transfer unit 37 disposed adjacent to the top ring unit 32.

The cleaning section 40 comprises a loading/unloading stage 2 for loading semiconductor substrates 1 to be processed and unloading semiconductor substrates 1 which have been processed, a dry substrate reversing unit 3 and a wet substrate reversing unit 4 for reversing, i.e., turning upside down, semiconductor substrates 1, a pair of delivering units 5A, 5B for delivering semiconductor substrates 1, three cleaning machines, i.e., a primary cleaning machine 7, a secondary cleaning machine 8 and a tertiary cleaning machine 9, and a film thickness measuring device 70 disposed above the delivering unit 5A.

Figure 2:
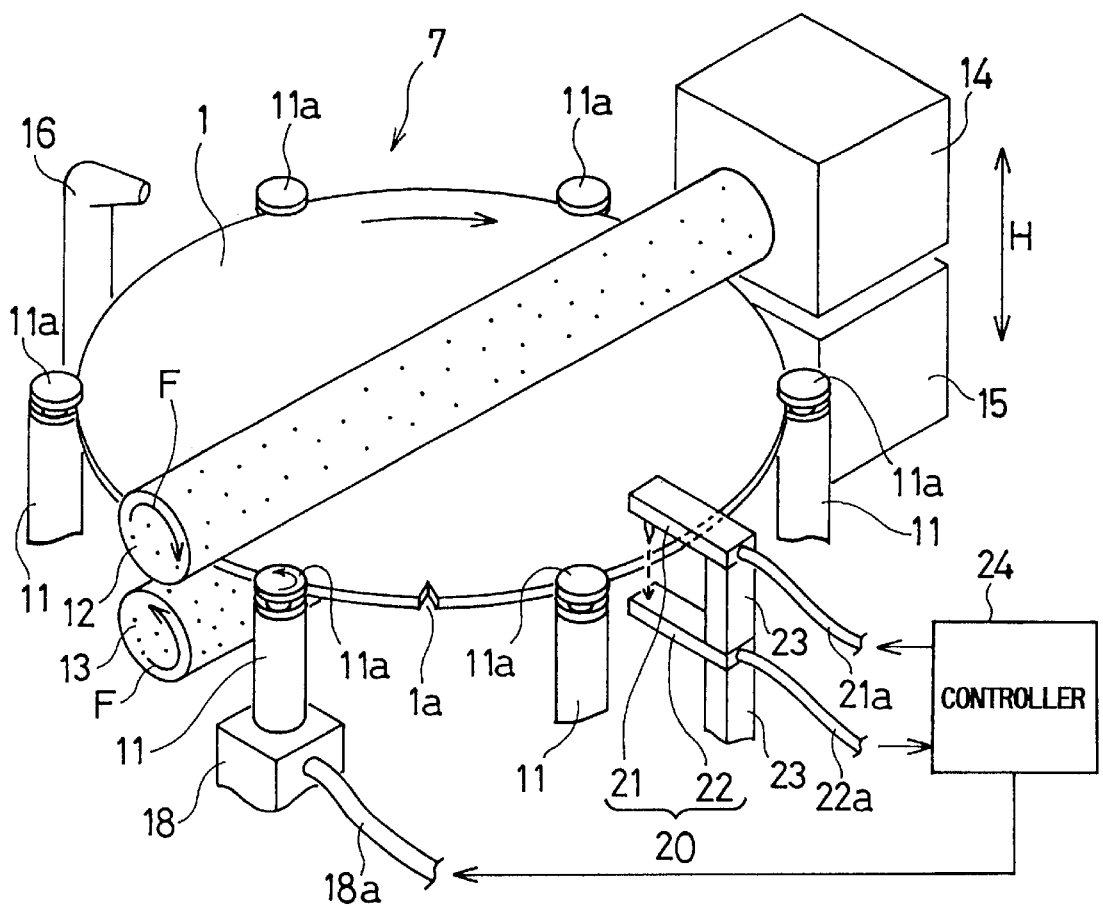
FIG. 2 is a perspective view schematically showing a primary cleaning machine shown in FIG. 1.

The primary cleaning machine 7 serves to clean, for the first time, a semiconductor substrate 1 which has been polished by the polishing section 30. Specifically, while holding and rotating the semiconductor substrate 1, the primary cleaning machine 7 supplies a cleaning liquid to both surfaces of the semiconductor substrate 1 and holds two cleaning members respectively against the surfaces of the semiconductor substrate 1, thereby cleaning the both surfaces of the semiconductor substrate 1. Specific structural details of the primary cleaning machine 7 for performing the first cleaning process are shown in FIG. 2.

Figure 3A:
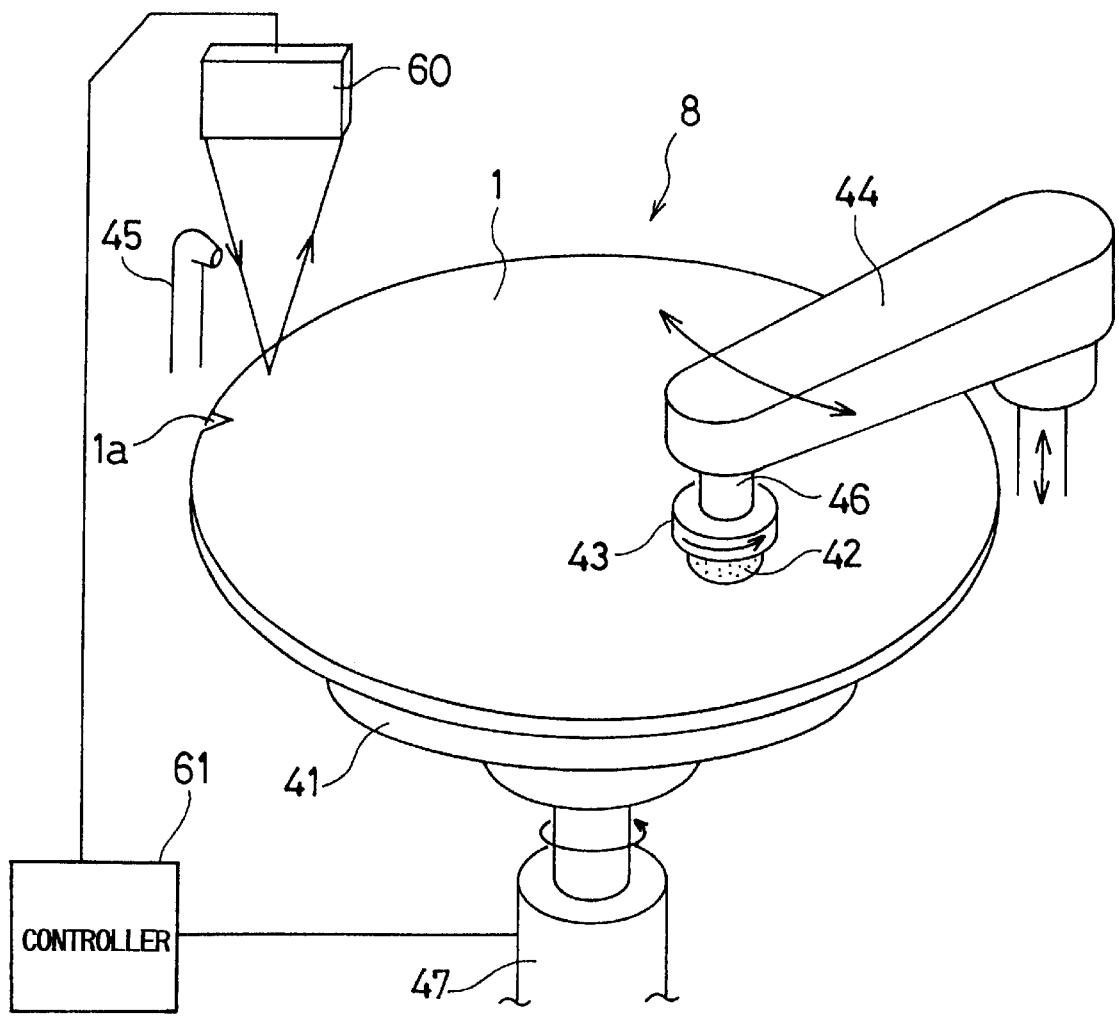
FIG. 3A is a perspective view schematically showing a secondary cleaning machine shown in FIG. 1.
Figure 3B:
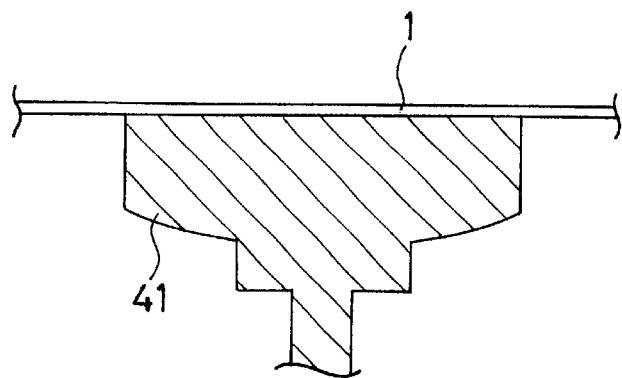
FIG. 3B is a vertical cross-sectional view showing a spinning chuck of the secondary cleaning machine shown in FIG. 1.

The secondary cleaning machine 8 serves to clean, for the second time, a semiconductor substrate 1 which has been cleaned by the primary cleaning machine 7. Specifically, while holding and rotating the semiconductor substrate 1, the secondary cleaning machine 8 supplies a cleaning liquid to a surface of the semiconductor substrate 1 and holds a cleaning member against the surface of the semiconductor substrate 1, thereby cleaning the polished surface of the semiconductor substrate 1. Specific structural details of the secondary cleaning machine 8 for performing the second cleaning process are shown in FIGS. 3A and 3B.

The tertiary cleaning machine 9 serves to finally clean and dry a semiconductor substrate 1 which has been cleaned by the secondary cleaning machine 8. Specifically, while holding and rotating the semiconductor substrate 1, the tertiary cleaning machine 9 ejects a cleaning liquid onto the polished surface of the semiconductor substrate 1 to clean the polished surface of the semiconductor substrate 1, then stops supplying the cleaning liquid, and spins the semiconductor substrate 1 to remove the cleaning liquid off from the surfaces of the semiconductor substrate 1 under centrifugal forces for thereby drying the surfaces of the semiconductor substrate 1. Specific structural details of the tertiary cleaning machine 9 for performing the third cleaning process are shown in FIG. 4.

In the polishing apparatus shown in FIG. 1, when a cassette 50 accommodating semiconductor substrates 1 to be polished is set on the loading/unloading stage 2, the delivering unit 5A takes one of the semiconductor substrates 1 out of the cassette 50 and delivers the semiconductor substrate 1 to the dry substrate reversing unit 3, which reverses the semiconductor substrate 1. Then, the delivering unit 5B receives the reversed semiconductor substrate 1 from the dry substrate reversing unit 3 and places the semiconductor substrate 1 on the transfer unit 37. The semiconductor substrate 1 is transferred from the transfer unit 37 to the top ring 33 which has moved to a position above the transfer unit 37. The top ring 33 holds the semiconductor substrate 1 under vacuum, moves to a position above the turntable 31, and presses the semiconductor substrate 1 against the polishing cloth constituting a polishing surface on the turntable 31. The lower surface of the semiconductor substrate 1 is polished by the polishing cloth while the turntable 31 and the top ring 33 are rotating independently of each other. Simultaneously, a polishing liquid is being supplied onto the polishing cloth. After the lower surface of the semiconductor substrate 1 has been polished, the top ring 33 moves back to the position above the transfer unit 37, and transfers the polished semiconductor substrate 1 to the transfer unit 37.

The semiconductor substrate 1 on the transfer unit 37 is then delivered by the delivering unit 5B to the wet substrate reversing unit 4, which reverses the semiconductor substrate 1. Thereafter, the semiconductor substrate 1 is delivered successively to the primary, secondary and tertiary cleaning machines 7, 8 and 9 by the delivering units 5A, 5B. The semiconductor substrate 1 is cleaned by the primary and secondary cleaning machines 7, 8, and then cleaned and dried by the tertiary cleaning machine 9. The film thickness measuring device 70 measures a film thickness at a plurality of predetermined measuring points on the semiconductor substrate 1 several times. Thereafter, the semiconductor substrate 1 is returned by the delivering unit 5A to the cassette 50 on the loading/unloading stage 2.

If the measured film thickness of the semiconductor substrate 1 is not within an allowable range, then the semiconductor substrate 1 may be returned to the polishing section 30 and polished again without being returned to the cassette 50. As the case may be, before the semiconductor substrate 1 is polished, i.e., after the semiconductor substrate 1 is taken out of the cassette 50, the film thickness measuring device 70 may measure a film thickness of the semiconductor substrate 1 and compare between the film thicknesses of the semiconductor substrate 1 before and after polishing.

The semiconductor substrates 1 are accommodated in the cassette 50 in such a manner that their reference positions, e.g., their notches, are aligned with a predetermined direction. Therefore, as described later on, even if the film thickness measuring device has no mechanism for detecting the reference position on a semiconductor substrate 1, the film thickness measuring device can accurately measure a film thickness at measuring points.

FIG. 2 is a perspective view showing structural details of the primary cleaning machine 7. As shown in FIG. 2, the primary cleaning machine 7 comprises six vertical spindles 11 for supporting the outer circumferential edge of a semiconductor substrate 1 and rotating the semiconductor substrate 1 in a horizontal plane, and a pair of straight cleaning arms 12, 13 made of sponge, PVA, or the like and extending horizontally diametrically above and below the semiconductor substrate 1. The primary cleaning machine 7 further comprises a pair of arm actuating mechanisms 14, 15 connected to respective ends of the cleaning arms 12, 13 for vertically moving the cleaning arms 12, 13 in directions indicated by the arrow H and rotating the cleaning arms 12, 13 about their respective axes as indicated by the arrows F, and a pair of cleaning liquid nozzles 16 for supplying a cleaning liquid such as ultrapure water to upper and lower surfaces of the semiconductor substrate 1. In FIG. 2, although only one cleaning nozzle 16 for supplying a cleaning liquid to the upper surface of the semiconductor substrate 1 is shown, another cleaning nozzle 16 is provided to supply a cleaning liquid to the lower surface of the semiconductor substrate 1. The semiconductor substrate 1 is of a circular shape and has a V-shaped notch 1a formed in the outer circumferential edge thereof as representing a reference position of the semiconductor substrate 1.

The vertical spindles 11 are disposed along the circumferential edge of the semiconductor substrate 1 and have respective retainers 11a on upper ends thereof which are capable of engaging the outer circumferential edge of the semiconductor substrate 1. The vertical spindles 11 are divided into two groups of three spindles 11 positioned on one side of the cleaning arms 12, 13 and other three spindles 11 positioned on the other side of the cleaning arms 12, 13. The two groups of the spindles 11 are movable horizontally toward each other to cause the retainers 11a to engage and hold the outer circumferential edge of the semiconductor substrate 1, and also movable horizontally away from each other to disengage and release the outer circumferential edge of the semiconductor substrate 1. In one of the two groups of the spindles 11, a spindle 11 positioned adjacent to the cleaning arms 12, 13 is coupled to a spindle rotating mechanism 18 having a servomotor (not shown). only this spindle 11 is driven by the spindle rotating mechanism 18 and is rotated. Other spindles 11 may be also provided with spindle rotating mechanisms 18. The spindle rotating mechanism 18 is electrically connected to a controller 24 by a signal wire 18a.

The primary cleaning machine 7 has a photosensor 20 for detecting the notch 1a formed in the outer circumferential edge of the semiconductor substrate 1. The photosensor 20 comprises a light-emitting element 21 positioned above the outer circumferential edge of the semiconductor substrate 1 for emitting light downwardly toward the semiconductor substrate 1, and a light-detecting element 22 positioned below the outer circumferential edge of the semiconductor substrate 1 for detecting the light emitted from the light-emitting element 21. The light-emitting element 21 and the light-detecting element 22 are supported on a vertical holder 23. The light-emitting element 21 and the light-detecting element 22 are electrically connected to the controller 24 by respective signal wires 21a, 22a.

In the structure shown in FIG. 2, when the cleaning arms 12, 13 are retracted upwardly and downwardly away from each other by the respective arm actuating mechanisms 14, 15 and also when the two groups of the spindles 11 are moved horizontally away from each other, a semiconductor substrate 1 is transferred by a robot hand of the delivering unit 5A or 5B from a position opposite to the arm actuating mechanisms 14, 15 longitudinally along the cleaning arms 12, 13 to a position above the spindles 11. Then, the hand of the delivering unit 5A or 5B is lowered to place the outer circumferential edge of the semiconductor substrate 1 onto shoulders of the retainers 11a. Then, the two groups of the spindles 11 are moved inwardly toward each other into the position shown in FIG. 2 until the retainers 11a hold the outer circumferential edge of the semiconductor substrate 1 which has been lowered. Thereafter, the hand of the delivering unit 5A or 5B is retracted away from the primary cleaning machine 7.

The spindle rotating mechanism 18 is operated to cause the spindle 11 coupled thereto to be rotated and thus to rotate the semiconductor substrate 1 about its own axis. While the semiconductor substrate 1 is being rotated, the arm actuating mechanisms 14, 15 are operated to lower and lift the respective cleaning arms 12, 13 into abutment against upper and lower surfaces, respectively, of the semiconductor substrate 1. The arm actuating mechanisms 14, 15 also rotate the cleaning arms 12, 13 about their respective axes as indicated by the arrows F to thereby clean the upper and lower surfaces of the semiconductor substrate 1. At this time, a cleaning liquid such as ultrapure water, ionic solution, dilute hydrofluoric acid, or hydrogen peroxide liquid is supplied from the cleaning liquid nozzles 16 to the upper and lower surfaces of the semiconductor substrate 1.

The photosensor 20 has its optical axis aligned with a detecting position capable of detecting the notch 1a formed in the outer circumferential edge of the semiconductor substrate 1 which is being rotated. When the notch 1a is not in the detecting position, the light emitted from the light-emitting element 21 is blocked by the outer circumferential edge of the semiconductor substrate 1. When the notch 1a passes through the detecting position, the light emitted from the light-emitting element 21 travels through the notch 1a to the light-detecting element 22, and the photosensor 20 converts the detected light into an electric signal that is transmitted to the controller 24. The controller 24 then determines the rotational speed of the semiconductor substrate 1 from the electric signal transmitted from the photosensor 20, and hence detects any rotation failure or rotation abnormality based on the determined rotational speed of the semiconductor substrate 1 and a control signal which is being supplied from the controller 24 to the spindle rotating mechanism 18. In the event that the controller 24 detects a rotation failure or a rotation abnormality, the controller 24 stops the primary cleaning machine 7, issues an alarm, or otherwise performs an appropriate action in response to the rotation failure or the rotation abnormality.

After the semiconductor substrate 1 is cleaned by the primary cleaning machine 7, the controller 24 controls the spindle rotating mechanism 18 to stop the rotation of the semiconductor substrate 1 at a predetermined position on the basis of the position where the input signal is transmitted from the photosensor 20. Therefore, the controller 24 can stop the semiconductor substrate 1 in such a manner that the notch 1a on the semiconductor substrate 1 is aligned with a predetermined direction.

Figure 7:
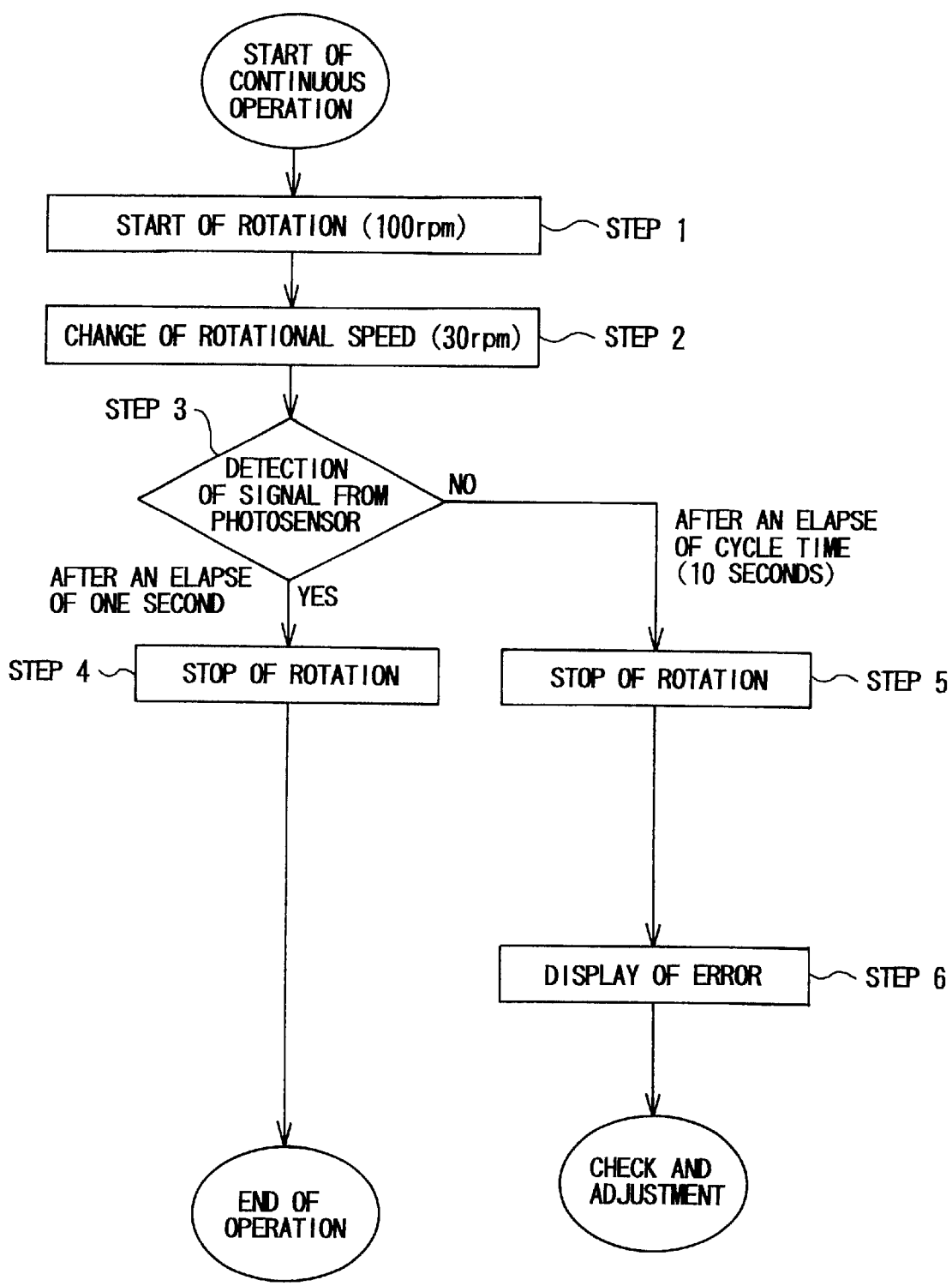
FIG. 7 is a flow chart; showing a controlling process of stopping a rotation of a semiconductor substrate in the primary cleaning machine shown in FIG. 2.

FIG. 7 shows a controlling process of stopping the semiconductor substrate 1 in the primary cleaning machine 7. As shown in FIG. 7, the semiconductor substrate 1 is rotated at 100 rpm while it is being cleaned by the cleaning arms 12, 13 (Step 1). Then, in order to detect the notch 1a on the semiconductor substrate 1, the controller 24 lowers the rotational speed of the semiconductor substrate 1 to 30 rpm (Step 2), and the detection process of the notch 1a described above is carried out (Step 3). When the notch 1a is detected, the controller 24 stops the rotation of the semiconductor substrate 1 after an elapse of one second since the detection of the notch 1a. Specifically, when the semiconductor substrate 1 makes a half rotation after the detection of the notch 1a, the rotation of the semiconductor substrate 1 is stopped (Step 4). The period from the detection of notch 1a to the stop of the semiconductor substrate 1 may be changed as the need arises. For example, the semiconductor substrate 1 may be stopped immediately after the detection of the notch 1a.

On the other hand, if the notch 1a fails to be detected in Step 3, the controller 24 stops the rotation of the semiconductor substrate 1 after an elapse of 10 seconds since the start of the detection process (Step 5). Then, the controller 24 sends a signal to a display device (not shown) to show an error in the notch detection process (Step 6). When the notch detection error occurs, various components or devices associated with the notch detection are checked and adjusted so that its notch 1a can be normally detected.

As describe above, in this embodiment, the controller 24 in the primary cleaning machine 7 includes a rotational speed control means for controlling the spindle rotating mechanism 18, whereby the semiconductor substrate 1 can be stopped at a predetermined angular position.

FIGS. 3A and 3B show the secondary cleaning machine 8. FIG. 3A is a perspective view schematically showing the secondary cleaning machine 8, and FIG. 3B is a vertical cross-sectional view showing a spinning chuck of the secondary cleaning machine 8. As shown in FIGS. 3A and 3B, the secondary cleaning machine 8 comprises a spinning chuck 41 for holding a semiconductor substrate 1 under vacuum and rotating the semiconductor substrate 1 in a horizontal plane at a predetermined rotational speed with a servomotor 47, and a rotatable support 43 supporting on a lower surface thereof a cleaning member 42 made of sponge or the like for cleaning the upper surface of the semiconductor substrate 1 on the spinning chuck 41. The secondary cleaning machine 8 further comprises a swing arm 44 vertically movable and angularly horizontally movable about a vertical axis located radially outwardly of the spinning chuck 41 and supporting the support 43 on a radially inner end, and a cleaning liquid nozzle 45 disposed radially outwardly of the spinning chuck 41 for ejecting a cleaning liquid to the upper surface of the semiconductor substrate 1 on the spinning chuck 41. The support 43 is rotatably supported on the radially inner end of the swing arm 44 by a vertical and rotatable shaft 46, and can be rotated at a predetermined rotational speed by an actuating mechanism (not shown) housed in the swing arm 44. The spinning chuck 41 and the servomotor 47 serve as a rotating mechanism for rotating the semiconductor substrate 1. The secondary cleaning machine 8 further comprises a controller 61 for controlling the rotation of the spinning chuck 41.

The controller 61 in the secondary cleaning machine 8 controls rotation of the semiconductor substrate 1 to stop the semiconductor substrate 1 at the same angular position as the rotational start position of the semiconductor substrate 1. As describe above, the semiconductor substrate 1 is aligned with a predetermined angular position in the primary cleaning machine 7. Therefore, after the semiconductor substrate 1 has been cleaned by the secondary cleaning machine 8, the semiconductor substrate 1 is aligned with the predetermined angular position without specific positional alignment in the secondary cleaning machine 8.

The secondary cleaning machine 8 also has a photosensor 60 positioned radially outwardly of the spinning chuck 41 for detecting the notch 1a formed in the outer circumferential edge of the semiconductor substrate 1. The photosensor 60, which is of the reflective type, comprises a light-emitting element (not shown) for emitting light downwardly to the semiconductor substrate 1 and a light-detecting element (not shown) for detecting light reflected from the semiconductor substrate 1. The servomotor 47 and the photosensor 60 are electrically connected to the controller 61.

In the structure shown in FIGS. 3A and 3B, a semiconductor substrate 1 is transferred by a hand of the delivering unit 5A or 5B to a position above the spinning chuck 41, and placed on the spinning chuck 41 in such a state that a surface to be cleaned faces upwardly. Thereafter, the hand of the delivering unit 5A or 5B is retracted away from the secondary cleaning machine 8. Then, the spinning chuck 41 is rotated by the servomotor 47 to rotate the semiconductor substrate 1 at a predetermined rotational speed, and the cleaning liquid nozzle 45 ejects a cleaning liquid onto a substantially central region of the upper surface of the semiconductor substrate 1, thereby starting cleaning of the upper surface of the semiconductor substrate 1.

The swing arm 44 is elevated and then angularly horizontally moved to move the support 43 to a position above the substantially central region of the upper surface of the semiconductor substrate 1. Then, the swing arm 44 is lowered to bring the cleaning member 42 into contact with the upper surface of the semiconductor substrate 1. The cleaning member 42 is pressed under a given pressure against the upper surface of the semiconductor substrate 1 which is being rotated by the spinning chuck 41, while at the same time the cleaning member 42 is being rotated independently of the semiconductor substrate 1. The swing arm 44 is angularly moved at a predetermined speed radially to the outer circumferential edge of the semiconductor substrate 1, thus scrubbing the upper surface of the semiconductor substrate 1.

When the swing arm 44 reaches the outer circumferential edge of the semiconductor substrate 1, the swing arm 44 stops its angular movement, and moves upwardly to lift the cleaning member 42 off the upper surface of the semiconductor substrate 1. The elevated swing arm 44 is angularly moved back to the position above the substantially central region of the upper surface of the semiconductor substrate 1. The above cleaning cycle is repeated.

The photosensor 60 has its optical axis aligned with a detecting position capable of detecting the notch 1*a* formed in the outer circumferential edge of the semiconductor substrate 1. When the notch 1*a* is not in the detecting position, the light emitted from the light-emitting element is reflected by the outer circumferential edge of the semiconductor substrate 1 and detected by the light-detecting element. When the notch 1*a* passes through the detecting position, the light emitted from the light-emitting element travels through the notch 1*a*. Thus, the light is not reflected by the outer circumferential edge of the semiconductor substrate 1, and is not detected by the light-detecting element. The light-detecting element converts the absence of reflected light into an electric signal that is transmitted to the controller 61. The controller 61 then determines the rotational speed of the semiconductor substrate 1 from the electric signal transmitted from the photosensor 60, and hence detects any rotation failure or rotation abnormality based on the determined rotational speed of the semiconductor substrate 1 and a control signal which is being supplied from the controller 61 to the servomotor 47. In the event that the controller 61 detects a rotation failure or a rotation abnormality, the controller 61 stops the secondary cleaning machine 8, issues an alarm, or otherwise performs an appropriate action in response to the rotation failure or the rotation abnormality.

FIG. 4 is a perspective view schematically showing the tertiary cleaning machine 9. As shown in FIG. 4, the tertiary cleaning machine 9 comprises a spinning chuck 41 for holding a semiconductor substrate 1 under vacuum and rotating the semiconductor substrate 1 in a horizontal plane at a predetermined rotational speed with a servomotor 47, and an angularly movable cleaning liquid nozzle 48 disposed above the spinning chuck 41 for ejecting a cleaning liquid having ultrasonic vibrational energy onto the upper surface of the semiconductor substrate 1 on the spinning chuck 41. The tertiary cleaning machine 9 further comprises a controller 61 for controlling the rotation of the spinning chuck 41. The spinning chuck 41 and the servomotor 47 are identical to those shown in FIGS. 3A and 3B, and serve as a rotating mechanism for rotating the semiconductor substrate 1. The cleaning liquid nozzle 48 is angularly movable over the spinning chuck 41 about a shaft which is positioned preferably radially outwardly of the spinning chuck 41. The controller 61 in the tertiary cleaning machine 9 controls the rotation of the semiconductor substrate 1 to stop the semiconductor substrate 1 at the same angular position as the rotational start position of the semiconductor substrate 1. As describe above, the semiconductor substrate 1 is aligned with a predetermined angular direction in the primary cleaning machine 7. Therefore, after the semiconductor substrate 1 has been cleaned by the tertiary cleaning machine 9, the semiconductor substrate 1 is aligned with the predetermined angular position without specific positional alignment in the tertiary cleaning machine 9.

The tertiary cleaning machine 9 also has a photosensor 60 positioned radially outwardly of the spinning chuck 41 for detecting the notch 1*a* formed in the outer circumferential edge of the semiconductor substrate 1. The photosensor 60 is of the reflective type which is the same as the photosensor 60 shown in FIG. 3A. The servomotor 47 and the photosensor 60 are electrically connected to the controller 61.

In the structure shown in FIG. 4, a semiconductor substrate 1 is transferred by a hand of the delivering unit 5A or 5B to a position above the spinning chuck 41, and placed on the spinning chuck 41 in such a state that a surface to be cleaned faces upwardly. Thereafter, the hand of the delivering unit 5A or 5B is retracted away from the tertiary cleaning machine 9. Then, the spinning chuck 41 is rotated by the servomotor 47 to rotate the semiconductor substrate 1 at a predetermined rotational speed, and the cleaning liquid nozzle 48 ejects a cleaning liquid having ultrasonic vibrational energy onto the upper surface of the semiconductor substrate 1, thereby cleaning the upper surface of the semiconductor substrate 1 while the cleaning liquid nozzle 48 is being angularly horizontally moved over the semiconductor substrate 1. After the upper surface of the semiconductor substrate 1 has been cleaned, the supply of the cleaning liquid from the cleaning liquid nozzle 48 and the angular movement of the cleaning liquid nozzle 48 over the semiconductor substrate 1 are stopped, and then the spinning chuck 41 is rotated at a higher rotational speed to remove any remaining cleaning liquid on the upper surface of the semiconductor substrate 1 under centrifugal forces. Thus, the upper surface of the semiconductor substrate 1 is dried. In the above cleaning and drying processes, the semiconductor substrate 1 is continuously rotated by the spinning chuck 41.

The photosensor 60 has its optical axis aligned with a detecting position capable of detecting the notch 1*a* formed in the outer circumferential edge of the semiconductor substrate 1 which is being rotated. When the notch 1*a* is not in the detecting position, the light emitted from the light-emitting element is reflected by the outer circumferential edge of the semiconductor substrate 1 and detected by the light-detecting element. When the notch 1*a* asses through the detecting position, the light emitted from the light-emitting element travels through the notch 1*a*. Thus, the light is not reflected by the outer circumferential edge of the semiconductor substrate 1, and is not detected by the light-detecting element. The light-detecting element converts the absence of reflected light into an electric signal that is transmitted to the controller 61. The controller 61 then determines the rotational speed of the semiconductor substrate 1 from the electric signal transmitted from the photosensor 60, and hence detects any rotation failure or rotation abnormality based on the determined rotational speed of the semiconductor substrate 1 and a control signal which is being supplied from the controller 61 to the servomotor 47. In the event that the controller 61 detects a rotation failure or a rotation abnormality, the controller 61 stops the tertiary cleaning machine 9, issues an alarm, or otherwise performs an appropriate action in response to the rotation failure or the rotation abnormality.

When the spin drying process is finished, the controller 61 controls the rotation of the semiconductor substrate 1 to stop the semiconductor substrate 1 at the same angular position as the rotational start position of the semiconductor substrate 1, and hence the semiconductor substrate 1 is stopped in such a state that the notch 1a on the semiconductor substrate 1 which has been aligned with the predetermined position in the primary cleaning machine 7 is aligned as it is.

If the rotation abnormality of the semiconductor substrate 1 is not need to be detected, the photosensors 60 are not required in the secondary and tertiary cleaning machines 8, 9. In this embodiment, in the primary cleaning machine 7, the notch 1a on the semiconductor substrate 1 is aligned with a predetermined direction. However, in the case where the notch 1a on the semiconductor substrate 1 is not aligned in the primary cleaning machine 7, the notch 1a of the semiconductor substrate 1 may be aligned with the predetermined direction in the secondary cleaning machine 8 or the tertiary cleaning machine 9 by the photosensor 60 and the controller 61 provided in the secondary cleaning machine 8 or tertiary cleaning machine 9.

Figure 5:
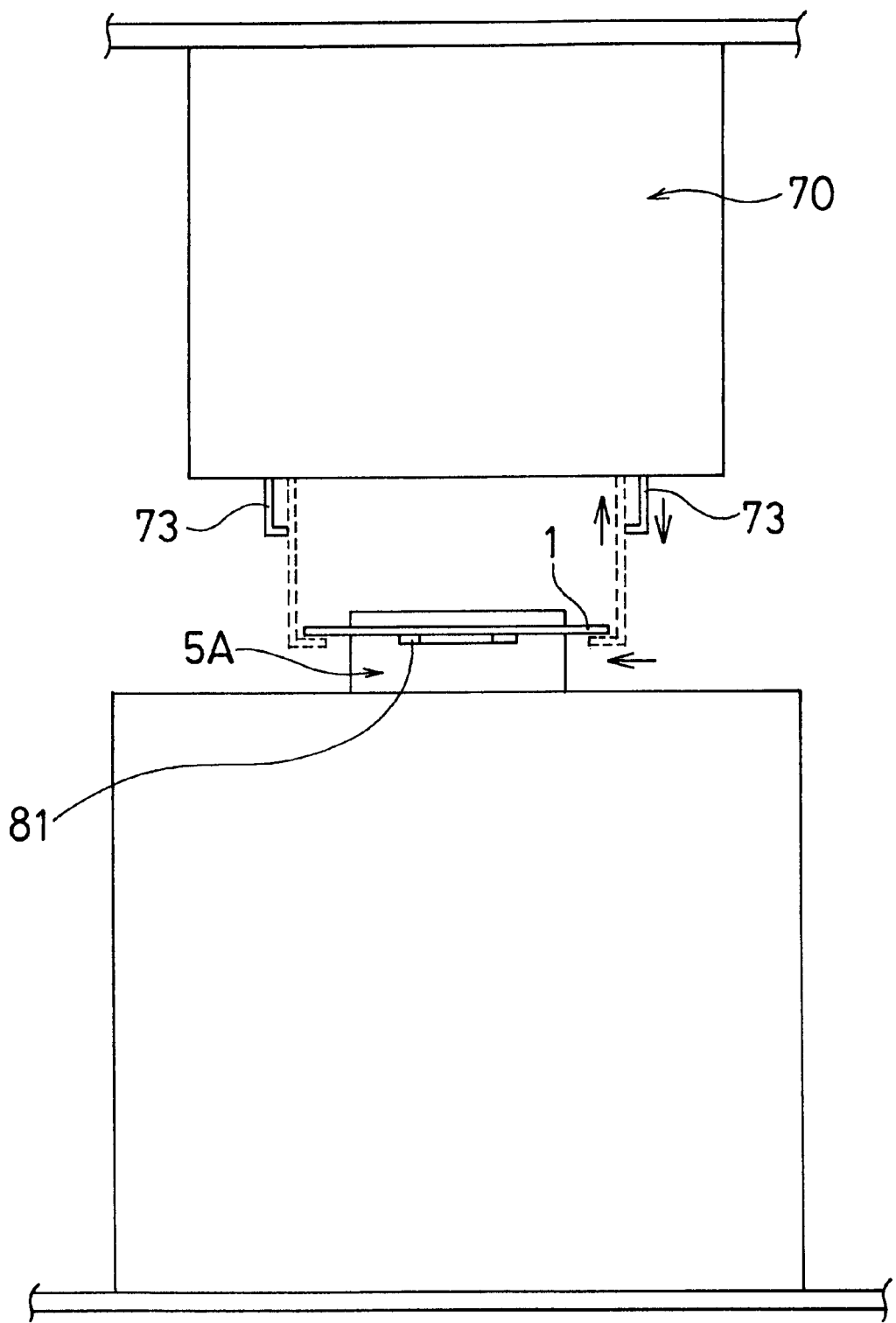
FIG. 5 is a front view showing a film thickness measuring device incorporated in a polishing apparatus shown in FIG. 1.

FIG. 5 is a schematic view showing the film thickness measuring device 70 incorporated in the polishing apparatus. FIG. 6A is a vertical cross-sectional view showing the film thickness measuring device 70 and FIG. 6B is a bottom view showing the film thickness measuring device 70. As shown in FIG.5, the film thickness measuring device 70 is disposed above the delivering unit 5A, and fixed to a ceiling of the polishing apparatus. As shown in FIGS. 6A and 6B, the film thickness measuring device 70 comprises chuck arms 73, 73 projecting downwardly from the lower side of a casing 71, chuck arm actuating mechanisms 75, 75 for moving the respective chuck arms 73, 73 in vertical and horizontal directions, an optical head 77 disposed in the casing 71 for measuring a film thickness of the semiconductor substrate 1, and an optical head actuating mechanism 79 for moving the optical head 77 horizontally in X and Y directions.

As shown in FIG. 5, the chuck arms 73, 73 are moved downwardly and then horizontally inwardly to hold the semiconductor substrate 1 placed on a robot hand 81 attached to a forward end of an arm of the delivering unit 5A. Thereafter, the chuck arms 73, 73 lift the semiconductor substrate 1 toward the optical head 77 shown in FIG. 6. The optical head 77 is moved horizontally in the X and Y directions to positions above predetermined measuring points on the semiconductor substrate 1 to measure a film thickness at the measuring points several times. Thus, a film thickness at a plurality of predetermined measuring points is measured by the optical head 77.

As described above, since the semiconductor substrate 1 which has been cleaned and dried by the primary, secondary, and tertiary cleaning machines 7, 8, and 9 is aligned with the predetermined direction, the optical head 77 can always be located above the predetermined position of the semiconductor substrate 1, and hence the film thickness measuring device 70 can accurately measure a film thickness at the predetermined measuring points.

Further, since the semiconductor substrate 1 is aligned with a predetermined direction, even if the semiconductor substrate 1 is returned to the cassette 50 on the loading/unloading stage 2 without positional alignment of the semiconductor substrate 1 after the film thickness measuring process described above, the semiconductor substrates 1 in the cassette 50 are aligned with the predetermined direction.

In the above embodiments, the notch has been described as representing the reference position of a semiconductor substrate 1. However, the notch may be replaced with an orientation flat, and such an orientation flat may be detected as representing the reference position of a semiconductor substrate 1.

The present invention offers the following advantages:
1) Without providing an additional device for aligning the reference position on a workpiece with a certain direction, the film thickness of a workpiece which has been cleaned can accurately and easily be measured with low cost.
2) Since no additional device for aligning the reference position on a workpiece with a certain direction is required, the cleaning section can be small-sized.

Although certain preferred embodiments of the present invention have been shown and described in detail, it should be understood that various changes and modifications may be made therein without departing from the scope of the appended claims.

What is claimed is:
1. A polishing apparatus for polishing a surface of a workpiece, said polishing apparatus comprising:
   a polishing section for polishing the surface of the workpiece;
   a cleaning section for cleaning the polished surface of the workpiece;
   a rotating mechanism provided at said cleaning section, said rotating mechanism for rotating the workpiece during cleaning or after cleaning;
   a sensor provided at said cleaning section, said sensor for detecting a reference position of the workpiece;
   a controller for controlling said rotating mechanism to stop rotation of the workpiece to align the reference position with a predetermined position based on a detection signal from said sensor; and
   a film thickness measuring device for measuring a thickness of a polished surface layer of the aligned workpiece.

2. A polishing apparatus according to claim 1, wherein said rotating mechanism is incorporated in a cleaning machine, and the workpiece is cleaned or dried while the workpiece is rotated by said rotating mechanism.

3. A polishing apparatus according to claim 1, wherein said controller controls said rotating mechanism to control a rotational speed of the workpiece.

4. A polishing apparatus according to claim 3, wherein said controller lowers the rotational speed of the workpiece when the reference position of the workpiece is detected by said sensor.

5. A polishing apparatus according to claim 3, wherein said controller controls said rotating mechanism to control the rotational speed of the workpiece based on an elapsed time from a detection of the reference position by said sensor.

6. A polishing apparatus according to claim 1, wherein said sensor comprises a photosensor.

7. A polishing method for polishing a surface of a workpiece, said polishing method comprising:

polishing the surface of the workpiece;

cleaning the polished surface of the workpiece at a cleaning section; detecting fa reference position of the workpiece with a sensor provided at the cleaning station;

aligning the reference position of the workpiece with a predetermining position at the cleaning section; and measuring a thickness of a polished surface layer of the aligned workpiece.

* * * * *

UNITED STATES PATENT AND TRADEMARK OFFICE
CERTIFICATE OF CORRECTION

PATENT NO. : 6,409,576 B1
DATED : June 25, 2002
INVENTOR(S) : Syozo Oguri et al.

It is certified that error appears in the above-identified patent and that said Letters Patent is hereby corrected as shown below:

Column 14,
Line 3, change "detecting fa reference" to -- detecting a reference --.

Signed and Sealed this

Thirtieth Day of July, 2002

*Attest:*

*Attesting Officer*

JAMES E. ROGAN
*Director of the United States Patent and Trademark Office*